United States Patent
Isobe

(10) Patent No.: US 7,978,517 B2
(45) Date of Patent: *Jul. 12, 2011

(54) NAND FLASH MEMORY

(75) Inventor: Katsuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/719,686

(22) Filed: Mar. 8, 2010

(65) Prior Publication Data

US 2010/0157676 A1  Jun. 24, 2010

Related U.S. Application Data

(63) Continuation of application No. 11/836,378, filed on Aug. 9, 2007, now Pat. No. 7,697,333.

(30) Foreign Application Priority Data

Aug. 16, 2006 (JP) .................. 2006-221997

(51) Int. Cl.
*G11C 11/34* (2006.01)

(52) U.S. Cl. ......... 365/185.11; 365/185.17; 365/185.18; 365/185.23; 365/185.27; 365/185.29; 365/185.33

(58) Field of Classification Search ............. 365/185.11, 365/185.17, 185.18, 185.23, 185.25, 185.26, 365/185.27, 185.33, 185.29

See application file for complete search history.

(56) References Cited

U.S. PATENT DOCUMENTS

| | | | |
|---|---|---|---|
| 6,005,802 A | 12/1999 | Takeuchi et al. | |
| 6,031,764 A | 2/2000 | Imamiya et al. | |
| 6,058,044 A * | 5/2000 | Sugiura et al. | 365/185.17 |
| 6,301,153 B1 | 10/2001 | Takeuchi et al. | |
| 6,330,189 B1 * | 12/2001 | Sakui et al. | 365/185.17 |
| 6,353,242 B1 * | 3/2002 | Watanabe et al. | 365/185.17 |
| 6,418,058 B1 | 7/2002 | Sakui et al. | |
| 6,522,583 B2 | 2/2003 | Kanda et al. | |
| 6,552,950 B2 | 4/2003 | Cho et al. | |
| 6,847,555 B2 | 1/2005 | Toda | |
| 6,927,998 B2 | 8/2005 | Takeuchi et al. | |
| 6,967,874 B2 | 11/2005 | Hosono | |
| 7,050,346 B2 | 5/2006 | Maejima et al. | |
| 7,120,057 B2 | 10/2006 | Umezawa et al. | |
| 7,245,530 B2 | 7/2007 | Ichikawa et al. | |
| 7,272,042 B2 * | 9/2007 | Nakai | 365/185.17 |
| 7,310,270 B2 | 12/2007 | Tanaka et al. | |
| 7,420,843 B2 | 9/2008 | Hosono | |
| 7,660,157 B2 * | 2/2010 | Maejima et al. | 365/185.17 |
| 7,663,919 B2 * | 2/2010 | Shibata et al. | 365/185.17 |

FOREIGN PATENT DOCUMENTS

JP  2001-332093  11/2001

* cited by examiner

*Primary Examiner* — Trong Phan

(74) *Attorney, Agent, or Firm* — Oblon, Spivak, McClelland, Maier & Neustadt, L.L.P.

(57) ABSTRACT

A NAND flash memory that is read while a selected bit line and a non-selected bit line are adjacent to each other, has a memory cell array having a plurality of blocks each of which is composed of a plurality of memory cell units, each of the memory cell units having a plurality of electrically rewritable memory cells that are connected to each other, wherein a bit line that is selected by a sense amplifier is charged in a state where a drain-side select gate line, a source-side select gate line and a p-type semiconductor substrate are set at a ground potential, and source lines, n-type wells, p-type wells, and a bit line that is not selected by the sense amplifier are in a floating state.

12 Claims, 9 Drawing Sheets

NAND FLASH MEMORY

CROSS-REFERENCE TO RELATED APPLICATION

The present application is a Continuation Application of U.S. application Ser. No. 11/836,378, filed Aug. 9, 2007, which is based upon and claims the benefit of priority from the prior Japanese Patent Application No. 2006-221997, filed on Aug. 16, 2006, the entire contents of each of which are incorporated herein by reference.

BACKGROUND OF THE INVENTION

1. Field of the Invention

The present invention relates to a NAND flash memory.

2. Background Art

Data writing to a non-volatile memory cell, such as a NAND flash memory, is achieved by changing the threshold of the cell by applying a high electrical field to the cell to cause trapping of an electron into an oxide film. On the other hand, data reading is achieved by using the variation in threshold. This principle holds true for multi-level memory cells (see Japanese Patent Laid-Open Publication No. 2001-332093, for example).

As an example of prior art, a reading operation of a NAND flash memory (of shielded bit line architecture) will be shortly described.

The source line and the well of a cell are set at a potential "$V_{SS}$" (0 V), and a potential "VSG" ("$V_{DD}$"+"Vth") (about 4 V), which allows transfer of "$V_{DD}$" (2.5 V), is applied to the gate "BLPRE" of the n-type MOS transistor of the sense amplifier. And, a potential of 0.7 V+Vth is applied to the gate "BLCLAMP" of the n-type MOS transistor that connects the sense amplifier and the bit line to each other, thereby pre-charging the bit line of the cell to a potential of 0.7 V.

However, not all the bit lines are charged to 0.7 V. The bit lines are alternately charged to 0.7 V and 0 V, and a half of the bit lines are to be read.

During reading, a bit line amplitude occurs due to the data. Adjacent bit lines are affected by the bit line amplitude due to the capacitive coupling. Thus, the bit lines are shielded to prevent data modification by data in the adjacent cells.

After the pre-charge, the gate "BLCLAMP" is set at 0 V, and the bit lines and the sense amplifier are separated from each other.

A desired potential "VCGRV" is applied to a word line to be read, a potential "VREAD" (about 5 V), which allows turn-on without fail, is applied to the other word lines and the drain-side select gate line, and finally the potential "VREAD" is applied to the source-side select gate line.

Thus, if the cell to be read is turned on, a cell current flows, and the potential of the bit line approaches 0 V. If the cell to be read is turned off, no cell current flows, so that the potential of the bit line remains at the pre-charge voltage (0.7 V).

The gate "BLPRE" is raised again, and the node "TDC" connected to the latch circuit of the sense amplifier is pre-charged to "$V_{DD}$". After that, the gate "BLCLAMP" is set at "VSEN" (0.35 V+Vth).

Compared with the capacitance of the bit line, the capacitance of the node "TDC" is low. Therefore, when the cell is turned on, if the potential of the bit line is lower than 0.35 V, charge sharing occurs, and the potential at the node "TDC" becomes equal to the potential of the bit line.

When the cell is turned off, if the potential of the bit line is equal to 0.7 V, the transistor having the gate "BLCLAMP" remains in the off state because the threshold thereof cannot be exceeded, and thus, the potential at the node "TDC" remains at "$V_{DD}$". By raising the potential at the gate of the n-type MOS transistor between the latch circuit and the node "TDC", the potential at the node "TDC" is transferred to the latch circuit, thereby designating H/L.

The threshold of the cell can be identified by changing the voltage "VCGRV" of the word line of the cell to be read. For example, if the cell has two thresholds, the cell can store two values. If the cell has four thresholds, the cell can store four values.

Thus, if the cell has 16 thresholds, the cell can store 16 values. To store 16 values, the retention margin of each threshold is reduced. Although the range of thresholds can be expanded to higher thresholds, higher thresholds lead to higher writing voltage and higher reading voltage.

If the writing or reading voltage increases, the writing or reading operation becomes more likely to be disturbed. As a result, there is a problem that the preset thresholds are also disturbed and shifted. The threshold shift causes erroneous reading.

Thus, it can be contemplated that, by setting a negative threshold, the retention margin can be enhanced without increasing the disturbance during reading or writing. Alternatively, this can be achieved by applying a negative potential to the word line.

However, the connection of the well is modified to enable transfer of the negative potential, and thus, the number of steps disadvantageously increases.

To overcome this disadvantage, the source line or p-type well of the cell can be biased. In this case, even if only a positive voltage is applied to the word line, the actual threshold "VGS" of the cell (the potential of the word line minus the potential of the source line of the cell) can be negative. That is, the threshold distribution can be formed also in the negative region.

However, biasing the source line or p-type well of the cell results in biasing of the source line or p-type well of other cells that don't need to be charged. Thus, there is a problem that the current consumption increases.

In addition, there is a problem that the reading or writing time increases because charging the source line or p-type well of the cell takes additional time (this is because the writing time includes the time required for verification, which is equivalent to reading, after writing).

If the source line or p-type well of the cell is not biased, only required is the charge for charging the bit line.

On the other hand, if the source line or p-type well of the cell is biased, an amount of charge is required to bias the source line or p-type well of the cell to a non-selected bit line (shielded bit line), in addition to the charge required for charging the bit line.

Biasing the source line or p-type well of the cell takes about 10 μs, for example, and therefore, the reading time increases accordingly.

SUMMARY OF THE INVENTION

According one aspect of the present invention, there is provided: a NAND flash memory that is read while a selected bit line and a non-selected bit line are adjacent to each other, comprising a memory cell array having a plurality of blocks each of which is composed of a plurality of memory cell units, each of said memory cell units having a plurality of electrically rewritable memory cells that are connected to each other and composed of a p-type well surrounded by an n-type well formed in a p-type semiconductor substrate, drain-side select gate transistors each of which connects a memory cell unit to a bit line and is connected to a drain-side select gate line at the gate thereof, and source-side select gate transistors each of which connects a memory cell unit to a source line and is connected to a source-side select gate line at the gate thereof; a row decoder that is connected to word lines, the drain-side select gate lines and the source-side gate line of said memory cell array, and applies a signal voltage to word lines, the drain-side select gate lines and the source-side gate line of said memory cell array for selecting a block; and a sense amplifier that is controlled by a column decoder and makes a selection from said bit lines of said memory cell array, wherein, in a block that is not selected by said row decoder, said bit line selected by said sense amplifier is charged in a state where the drain-side select gate line, the source-side select gate line and the p-type semiconductor substrate are set at a ground potential, and the source lines, the n-type wells, the p-type wells and a bit line that is not selected by said sense amplifier are in a floating state.

According another aspect of the present invention, there is provided: a NAND flash memory that is read while a selected bit line and a non-selected bit line are adjacent to each other, comprising a memory cell array having a plurality of blocks each of which is composed of a plurality of memory cell units, each of said memory cell units having a plurality of electrically rewritable memory cells that are connected to each other and composed of a p-type well surrounded by an n-type well formed in a p-type semiconductor substrate, drain-side select gate transistors each of which connects a memory cell unit to a bit line and is connected to a drain-side select gate line at the gate thereof, and source-side select gate transistors each of which connects a memory cell unit to a source line and is connected to a source-side select gate line at the gate thereof; a row decoder that is connected to word lines, the drain-side select gate lines and the source-side gate line of said memory cell array, and applies a signal voltage to word lines, the drain-side select gate lines and the source-side gate line of said memory cell array for selecting a block; and a sense amplifier that is controlled by a column decoder and makes a selection from said bit lines of said memory cell array, wherein in a block that is not selected by said row decoder, said bit line selected by said sense amplifier is charged to a first potential at the same time as the drain-side select gate line, the source-side select gate line and the p-type semiconductor substrate being set at a ground potential, and the source lines, the n-type wells, the p-type wells and the bit line that is not selected by said sense amplifier being charged to a second potential that is between said first potential and said ground potential.

According further aspect of the present invention, there is provided; a NAND flash memory that is read while a selected bit line and a non-selected bit line are adjacent to each other, comprising a memory cell array having a plurality of blocks each of which is composed of a plurality of memory cell units, each of said memory cell units having a plurality of electrically rewritable memory cells that are connected to each other and composed of a p-type well surrounded by an n-type well formed in a p-type semiconductor substrate, drain-side select gate transistors each of which connects a memory cell unit to a bit line and is connected to a drain-side select gate line at the gate thereof, and source-side select gate transistors each of which connects a memory cell unit to a source line and is connected to a source-side select gate line at the gate thereof; a row decoder that is connected to word lines, the drain-side select gate lines and the source-side gate line of said memory cell array, and applies a signal voltage to word lines, the drain-side select gate lines and the source-side gate line of said memory cell array for selecting a block; and a sense amplifier that is controlled by a column decoder and makes a selection from said bit lines of said memory cell array, wherein in a block that is not selected by said row decoder, said bit line selected by said sense amplifier is charged to the first potential while the drain-side select gate line, the source-side select gate line and the p-type semiconductor substrate are being set at a ground potential, and the source lines, the n-type wells, the p-type wells and the bit line that is not selected by said sense amplifier are being charged to a second potential that is between said first potential and said ground potential.

DETAILED DESCRIPTION

According to the prior art described above, when reading by biasing the source line or p-type well of a NAND flash memory cell, the bit line is charged after the source line or p-type well of the cell is biased. In this case, an amount of charge is required not only to charge the bit line but also to bias the source line or p-type well of the cell. The amount of charge leads to an increase in current and pre-charge time and thus to degradation in performance of the NAND flash memory.

Thus, for a NAND flash memory according to an aspect of the present invention, bit lines are charged while source lines, p-type wells and non-selected bit lines of cells are kept in a floating state. As a result, in a coupling state, the source lines, the p-type wells and the non-selected bit lines of the cells settle at a potential that is determined by the coupling ratio. Thus, the amount of charge that would otherwise be required for charging thereof is not required, and the charging operation can be ended without any extra time. Therefore, the charging can be achieved in a short time.

Thus, the threshold distribution can be formed also in the negative region while preventing an increase in current and pre-charge time.

In the following, embodiments of the present invention will be described with reference to the drawings.

First Embodiment

Figure 1:
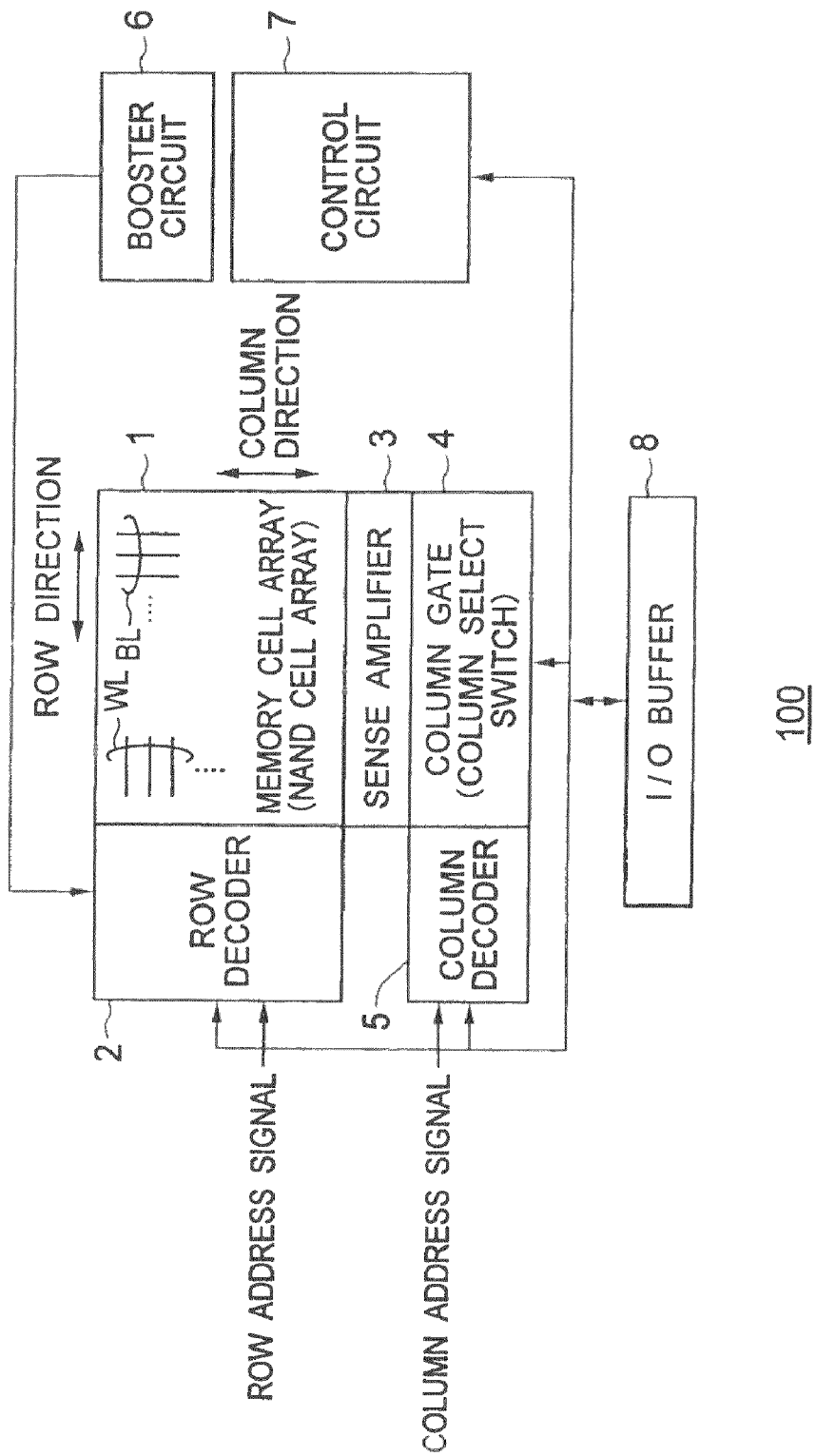
FIG. 1 is a block diagram showing a configuration of essential parts of a NAND flash memory 100 according to an First Embodiment of the present invention, which is an aspect of the present invention.
Figure 2:
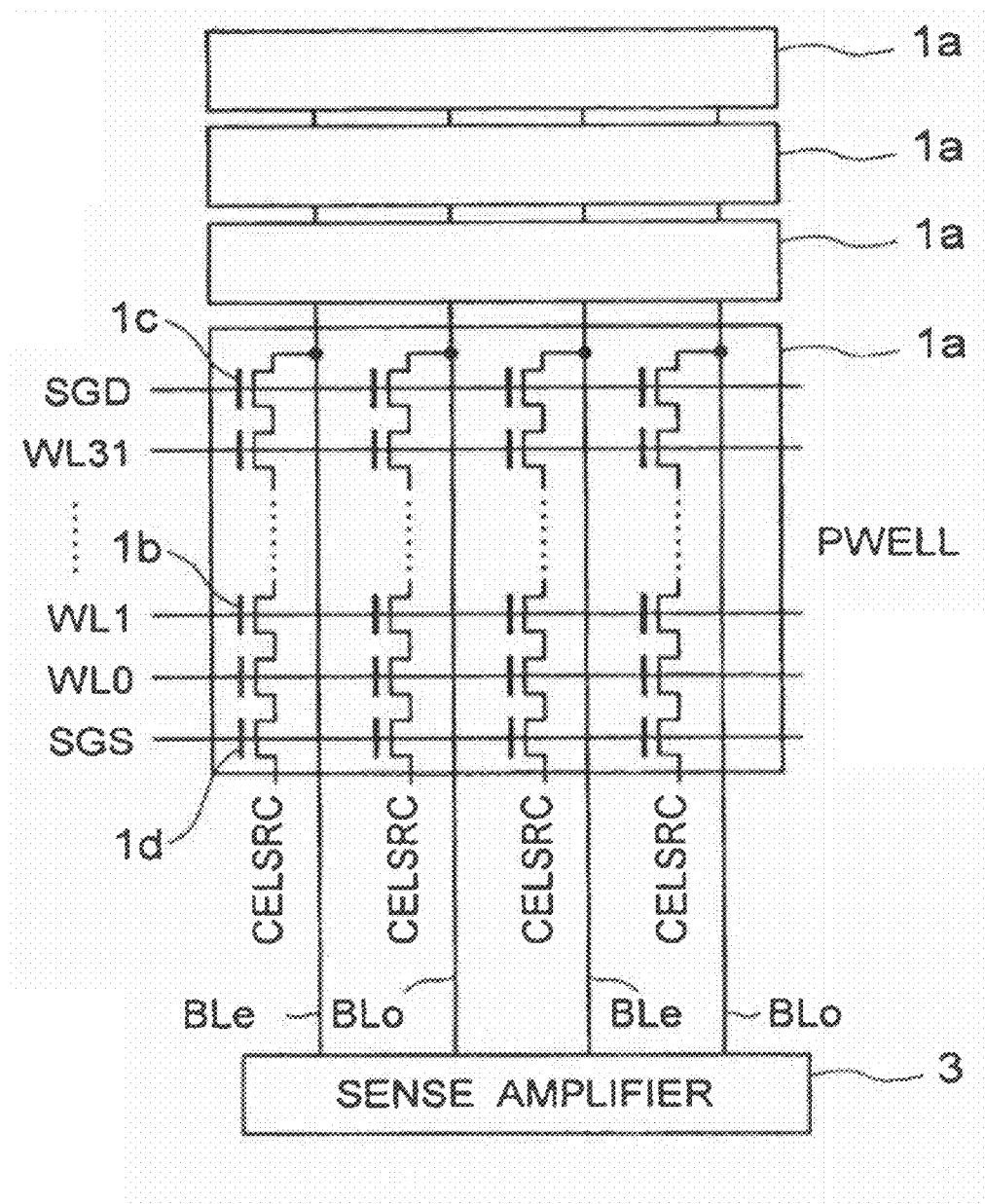
FIG. 2 is a diagram showing a configuration of essential parts of a memory cell array of the NAND flash memory 100 shown in FIG. 1.
Figure 3:
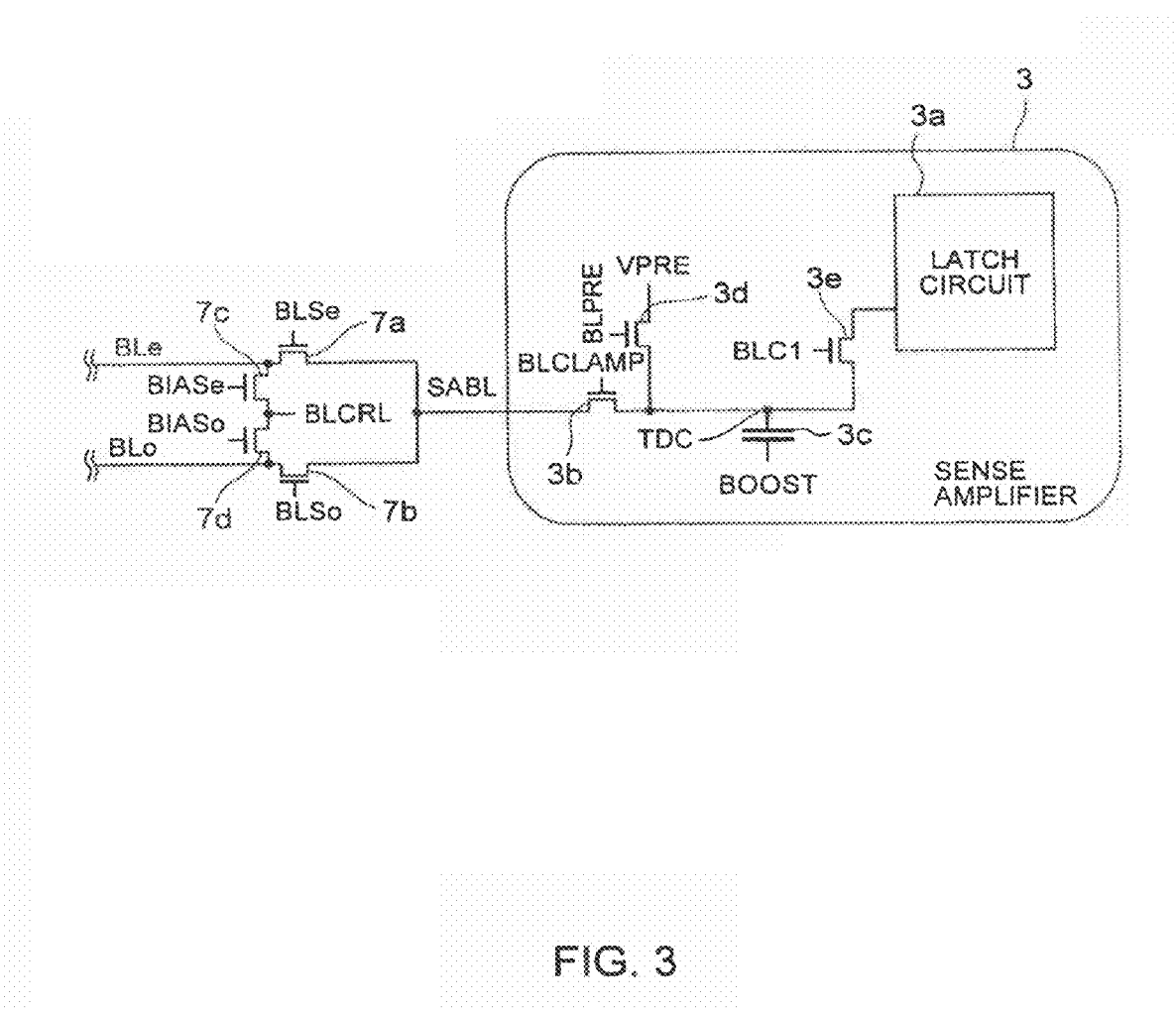
FIG. 3 is a diagram showing a configuration of essential parts of a sense amplifier of the NAND flash memory 100 shown in FIG. 1.

FIG. 1 is a block diagram showing a configuration of essential parts of a NAND flash memory 100 according to a First Embodiment of the present invention, which is an aspect of the present invention. FIG. 2 is a diagram showing a configuration of essential parts of a memory cell array of the NAND flash memory 100 shown in FIG. 1. FIG. 3 is a diagram showing a configuration of essential parts of a sense amplifier of the NAND flash memory 100 shown in FIG. 1.

As shown in FIGS. 1 and 2, a memory cell array 1 has a plurality of cell units arranged in an array. On the memory cell array 1, word lines (control gate lines) "WL" extending in a row direction and bit lines "BL (BLe, BLo)" extending in a column direction are disposed. The word lines "WL" are connected to a row decoder 2, and the bit lines "BL" are connected to a sense amplifier 3, which has a latch circuit for temporarily storing write data and read data.

The memory cell array 1 has a plurality of blocks 1a. A block 1a is composed of a plurality of memory cell units composed of a plurality of memory cells 1b connected to each other, drain-side select gate transistors 1c that connect the memory cell units to the respective bit lines "BL" and are connected to a drain-side select gate line "SGD" at the respective gates thereof, and source-side select gate transistors 1d that connect the memory cell units to respective source lines "CELSRC" and are connected to a source-side select gate line SGC at the respective gates.

As described above, each cell unit is composed of a plurality of electrically rewritable memory cells 1b, which have a p-type well "PWELL" surrounded by an n-type well NWEL formed in a p-type semiconductor substrate "Psub".

The sense amplifier 3 is connected to an I/O buffer 8 via a column gate (column select switch) 4. The column gate 4 is controlled by an output signal from a column decoder 5. That is, the sense amplifier 3 is controlled by the column decoder 5 and makes a selection from the bit lines "BL" in the memory cell array 1.

As shown in FIG. 3, the sense amplifier 3 has a latch circuit 3a for storing the potential at a node "TDC", a transistor 3b connected between the node "TDC" and bit lines "BLe", "BLo".

Furthermore, the sense amplifier 3 has a capacitor 3c connected to the node "TDC", a transistor 3d for controlling a voltage VPRE applied to the node "TDC", a transistor 3e connected between the node "TDC" and the latch circuit 3a.

In FIG. 3, the potentials at "BLSe" and "BLSo" are controlled by a control circuit 7 in such a manner that transistors 7a and 7b are alternately turned on. Thus, when the transistor 7a is turned on, "SABL" is electrically connected to the bit line "BLe", and when the transistor 7b is turned on, "SABL" is electrically connected to the bit line "BLo". In other words, the bit lines "BLe" and "BLo" are alternately selected by controlling the potentials at "BLSe" and "BLSo".

Furthermore, the potentials at "BIASe" and "BIASo" are controlled by the control circuit 7, and transistors 7c and 7d are alternately turned on so that the potential of a control line "BLCRL" is supplied to the bit line not selected.

As shown in FIG. 1, a booster circuit 6 generates voltages required in a write mode, an erase mode and a read mode. For example, when writing data, the booster circuit 6 generates a write voltage and supplies the write voltage to the row decoder 2.

The row decoder 2 is connected to the word lines "WL" and the select gate lines of the memory cell array 1 and applies a signal voltage to the word lines "WL" and the select gate lines of the memory cell array 1 for selecting a block. A row address signal is input to the row decoder 2, and a column address signal is input to the column decoder 5.

The control circuit 7 controls the operation of the row decoder 2, the column gate 4 and the column decoder 5 depending on the operation mode. For example, when writing data, the control circuit 7 controls the timing of switching of the potential supplied to the word lines "WL" and the select gate lines "SGD" and "SGS".

Figure 4:
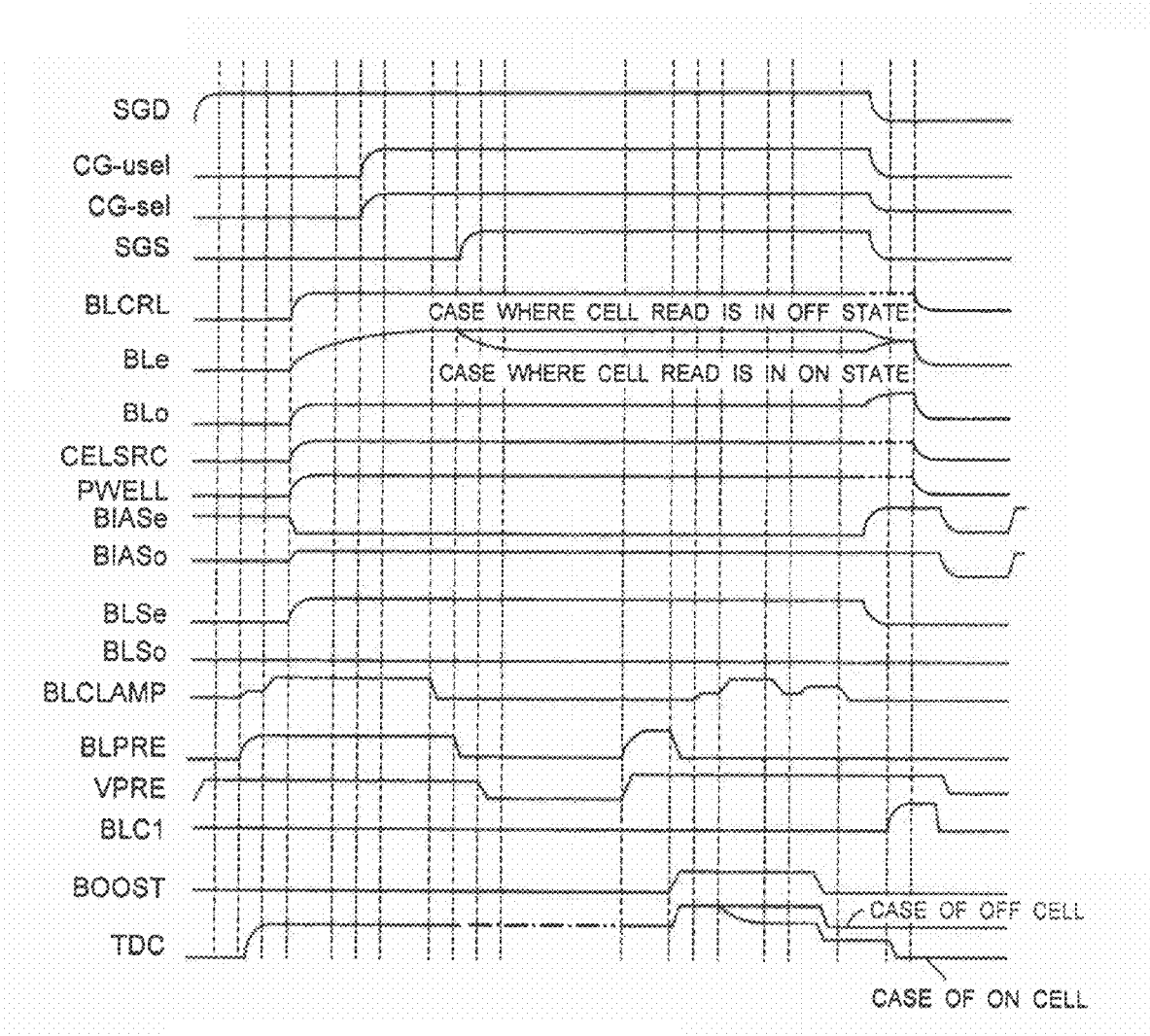
FIG. 4 is a timing chart for illustrating the read operation of the NAND flash memory 100.

Now, a read operation of the NAND flash memory 100 configured as described above will be described. FIG. 4 is a timing chart for illustrating the read operation of the NAND flash memory 100.

In the following, with reference to FIGS. 2 to 4, there will be particularly described a reading method in a case where the source line "CELSRC" and the p-type semiconductor substrate "PWELL" of a cell are biased to a potential "Vs" in order to form the cell threshold distribution in the negative region.

First, the source line "CELSRC" and the p-type semiconductor substrate "PWELL" of the cell are set at a potential "Vs" (1.6 V). In addition, a potential "VSG" ($V_{DD}$+Vth) (4 V), which allows an n-type MOS transistor to transfer a potential "$V_{DD}$" (2.5 V) to a gate "BLPRE", is applied to "VPRE". Then, a potential of 0.7 V+Vth+Vs is applied to a gate "BLCLAMP". Thus, the potential at the gate "BLSe" controlled by the control circuit 7 is raised to "High", and the selected bit line "BLe" is pre-charged to a potential of 0.7 V+Vs (=2.3 V).

After the pre-charge, the potential at the gate "BLCLAMP" is set at 0 V, thereby separating the bit lines "BL" and the sense amplifier 3.

Furthermore, a potential "VCGRV" is applied to the word line "WL" to be read ("CG-sel"), and a potential "VREAD" (6.5 V), which allows turn-on without fail, is applied to the other word lines "WL" ("CG-usel") and the drain-side select gate line "SGD". Then, a potential "VREAD" is applied to the source-side select gate line "SGS".

Thus, if a cell to be read is turned on (the case where cell read is in on state), a cell current flows, and the bit line "BLe" is brought closer to the potential Vs.

On the other hand, if a cell to be read is turned off (the case where cell read is in off state), no cell current flows, and the bit line "BLe" remains at the pre-charge potential (0.7 V+Vs).

The potential "VPRE" and the potential at the gate "BLPRE" are raised again to pre-charge the node "TDC" to the potential "$V_{DD}$". Furthermore, "BOOST" is raised to raise the potential at the node "TDC" to about 4.5 V by capacitive coupling. Then, the potential at the gate "BLCLAMP" is set at a potential "VSEN" (0.5 V+Vth+Vs).

Compared with the capacitance of the bit line "BL", the capacitance of the node "TDC" is small. Therefore, when the cell is turned on (the case of on cell), if the potential of the bit line "BLe" is lower than 0.5 V+Vs, charge sharing occurs, and the potential at the not "TDC" becomes equal to the potential of the bit line "BLe".

When the cell is turned off (the case of off cell), if the potential of the bit line "BL" is equal to 0.7 V+Vs, the voltage applied to the gate "BLCLAMP" cannot exceed the threshold of the transistor 3b. Thus, the transistor 3b remains in the off state, and the potential at the node "TDC" remains at 4.5 V.

Then, after the potential at the gate "BLCLAMP" is temporarily raised, "BOOST" is lowered while a voltage "VTR" (1.2 V) slightly higher than the threshold of the transistor 3b having the gate "BLCLAMP" is being applied.

As a result, the potential at the node "TDC" is lowered due to capacitive coupling. The potential at the node "TDC" connected to the turned-on cell is lowered to approach 0 V. The potential at the node "TDC" connected to the turned-off cell returns to "$V_{DD}$".

Then, the potential at a gate "BLC1" is raised to transfer the potential at the node "TDC" to the latch circuit 3a, thereby designating H/L.

Through the operation described above, reading of the NAND flash memory 100 is achieved while the selected bit line "BLe" and the non-selected bit line "BLo" are adjacent to each other.

The potential of the non-selected bit line "BLo", which is not selected as a result of the potential at the gate "BLSo" being kept at "Low" under the control of the control circuit 7, is set at Vs (1.6 V) when the potential at "BIASo" is raised to "High" under the control of the control circuit 7.

Figure 5:
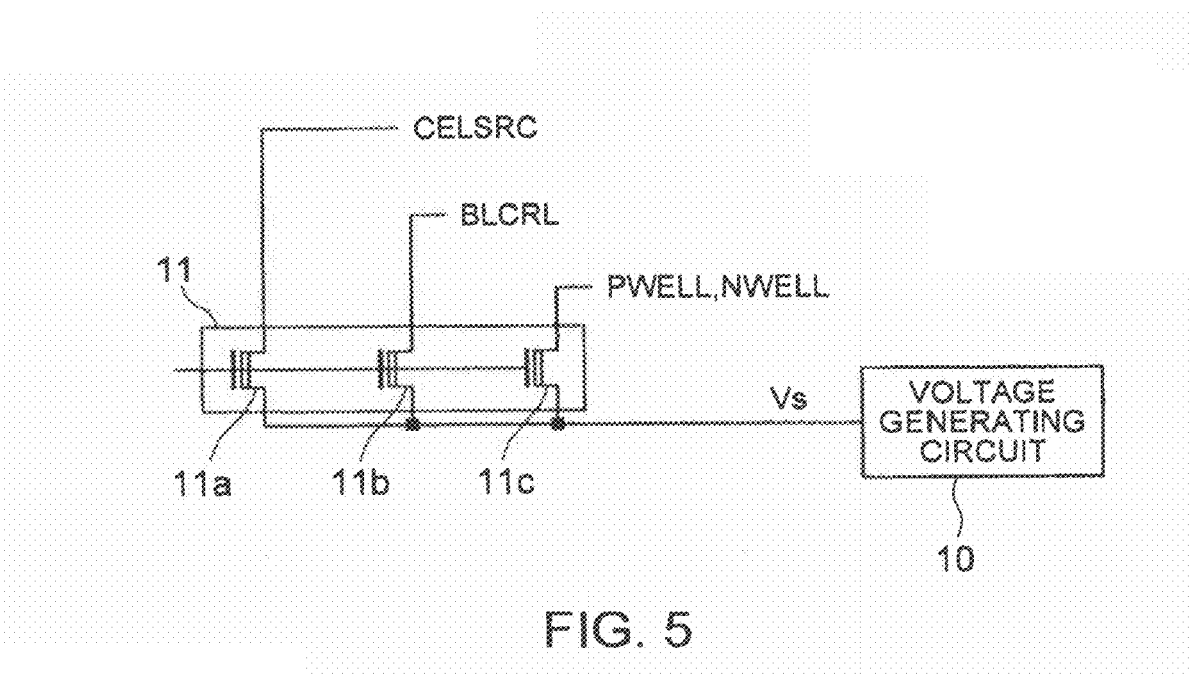
FIG. 5 is a diagram showing a configuration of essential parts including a voltage generating circuit that applies the voltage Vs.

FIG. 5 is a diagram showing a configuration of essential parts including a voltage generating circuit that applies the voltage Vs.

As shown in FIG. 5, a voltage generating circuit 10 is connected to the source line "CELSRC", the control line "BLCRL", the p-type well "PWELL" and the n-type well of the cell via a switch circuit 11 having transistors 11a, 11b and 11c. The voltage generating circuit 10 applies the voltage "Vs" to the source line "CELSRC" of the cell, the control line "BLCRL" connected to the bit line (shielded bit line) "BLo" not selected in FIG. 3, and the p-type well "PWELL" and n-type well "NWELL" by turning on the transistors 11a, 11b and 11c, respectively.

In addition, after the voltage "Vs" is applied, the source line "CELSRC" of the cell, the non-selected bit line (shielded bit line) "BLo", and the p-type well "PWELL" and n-type well "NWELL" can be brought into the floating state by turning off the transistors 11a, 11b and 11c, respectively.

Now, the amount of charge required to charge the bit line in the reading operation described above will be discussed.

Figure 6A:
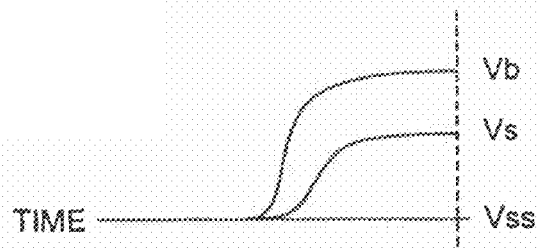
FIG. 6A is a graph showing a relationship between time and voltage applied to the selected bit line or the like of the NAND flash memory 100 during the reading operation according to the First Embodiment.
Figure 6B:
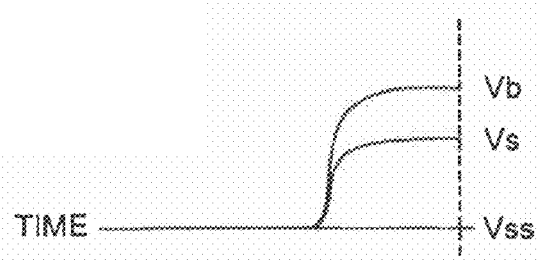
FIG. 6B is a graph showing another relationship between time and voltage applied to the selected bit line or the like of the NAND flash memory 100 during the reading operation according to the First Embodiment.
Figure 7:
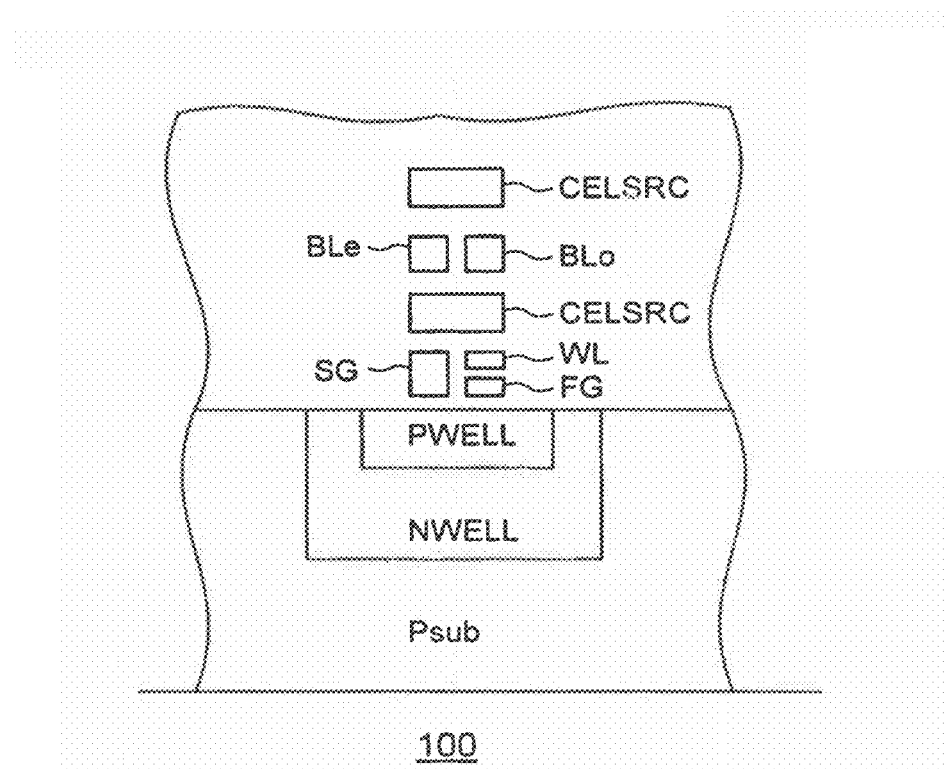
FIG. 7 is a diagram showing a model of a cross-sectional structure of the NAND flash memory 100.
Figure 8:
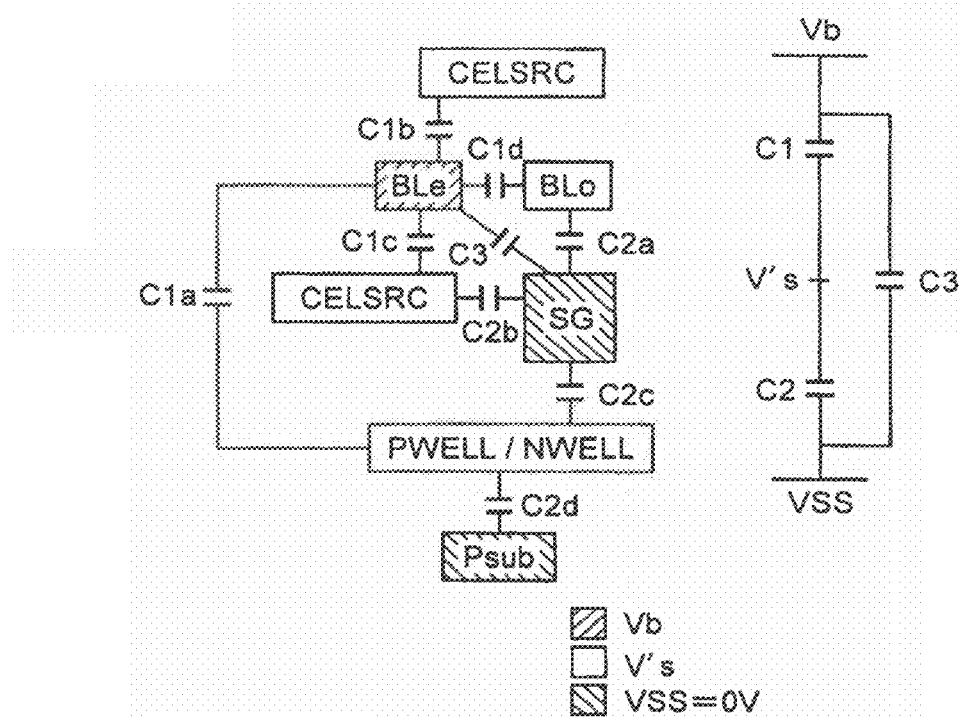
FIG. 8 is a diagram showing potentials at the parts of the NAND flash memory 100 shown in FIG. 7 and capacitances between the parts.

FIG. 6A is a graph showing a relationship between time and voltage applied to the selected bit line or the like of the NAND flash memory 100 during the reading operation according to the First Embodiment. FIG. 6B is a graph showing another relationship between time and voltage applied to the selected bit line or the like of the NAND flash memory 100 during the reading operation according to the First Embodiment. FIG. 7 is a diagram showing a model of a cross-sectional structure of the NAND flash memory 100. FIG. 8 is a diagram showing potentials at the parts of the NAND flash memory 100 shown in FIG. 7 and capacitances between the parts.

As shown in FIG. 6A and FIG. 4 described above, the drain-side select gate line "SGD", the source-side select gate line "SGS" and the p-type semiconductor substrate "Psub" of the block not selected by the row decoder 2 are set at a ground potential "Vss". In addition, the source line "CELSRC", the p-type well "PWELL" and the n-type well "NWELL" of the cells of the non-selected block, and the bit line (shielded bit line) "BLo" not selected by the sense amplifier 3 are brought into the floating state (the potential "Vs"). In this state, the bit line "BLe" selected by the sense amplifier 3 is charged to "Vb" (2.3 V). The word lines "WL" of the non-selected block are in the floating state.

The parts of the NAND flash memory 100 are arranged as shown in FIG. 7. As shown in FIG. 8, capacitances between the parts are denoted by "C1" (a combined capacitance of "C1a", "C1b", "C1c" and "C1d"), "C2" (a combined capacitance of "C2a", "C2b", "C2c" and "C2d") and "C3". In FIG. 8, the control gate is included in the select gate line SG. Furthermore, in FIG. 8, illustration of the word lines "WL" and the floating gates FG (in FIG. 7) of the non-selected block in the floating state is omitted, because the effect thereof on the change in potential is small.

The source line "CELSRC", the p-type well "PWELL", the n-type well "NWELL" and the non-selected bit line of the cell converges to a potential "Vs'", which is determined by the coupling ratio.

$$Vs' = Vb\left(\frac{C1}{C1+C2}\right)$$

Thus, the amount of charge "Q" required for charging to "Vs'", that is, required for charging the bit line "BLe" to "Vb" can be considered as a series capacitance. Thus, the amount of charge "Q" can be expressed as follows (FIG. 8).

$$Q = Vb\left(\frac{C1C2}{C1+C2} + C3\right)$$

Where, supposing that "C1"=130 nF, "C2"=50 nF, "C3"=10 nF and "Vb"=2.3 V, "Vs'"=1.66 V, and "Q"=106 nC.

Now, there will be discussed a case similar to the prior art described earlier where only the selected bit line is charged without charging the source line "CELSRC", the p-type well "PWELL", the n-type well "NWELL" and the non-selected bit line "BLo" of the cell.

For example, supposing that the bit line charge potential is "Vb", and the bit line capacitance is (C1+C3), the required amount of charge is Vb*(C1+C3). Supposing that "Vb"=0.7 V, and C1+C3=140 nF, the amount of charge required to charge the bit line is 98 nC.

Furthermore, there will be discussed a case similar to the prior art where the selected bit line is charged after the source line "CELSRC", the p-type well "PWELL", the n-type well "NWELL" and the non-selected bit line "BLo" of the cell are charged.

For example, if it is supposed that the potential of the p-type semiconductor substrate "Psub" and the non-selected select gate is "$V_{SS}$", and the word lines "WL" of the non-selected block are in the floating state, the other nodes are charged to "Vs" (the word lines "WL" and select gate line of the selected block are ignored because the effect thereof is extremely small). The amount of charge required for this charging is Vs*(C2+C3). The amount of charge required to charge the bit line is (Vb−Vs)*(C1+C3). Supposing that "Vs'"=1.6 V, "Vb"=2.3 V, C2+C3=60 nF, and C1+C3=140 nF, the total amount of charge is 194 nC (=96 nC+98 nC). The required amount of charge is doubled by biasing the source line "CELSRC", the p-type well "PWELL" and the n-type well "NWELL" of the cell.

As described above, in this embodiment, the amount of charge "Q required to charge the selected bit line "BLe" of the non-selected block to "Vb" depends on the ratio between the capacitances "C1" and "C2". However, compared with a case where the selected bit line is charged after the source line "CELSRC", the p-type well "PWELL", the n-type well "NWELL" and the non-selected bit line "BLo" of the cell are charged in the non-selected block, the required amount of charge "Q can be approximately halved if "Vs'" determined by the coupling ratio is close to a target.

Furthermore, even compared with a case where only the selected bit line is charged without charging the source line "CELSRC", the p-type well "PWELL", the n-type well "NWELL" and the non-selected bit line "BLo" of the cell, the required amount of charge is substantially the same although the amount slightly increases. Thus, charging can be completed in substantially the same time as a case where only the selected bit line is charged without charging the source line "CELSRC", the p-type well "PWELL", the n-type well "NWELL" and the non-selected bit line "BLo" of the cell.

In this way, the threshold distribution of the cell can be formed not only in the positive region but also in the negative region without significantly changing the required amount of charge and increasing the charge time.

If the coupling ratio varies, the potential "Vs" is shifted from the target potential. Thus, in order to compensate for the shift, charge exchange with the voltage generating circuit 10 that applies the potential "Vs" is required.

Thus, as shown in FIG. 6B, in the block not selected by the row decoder 2, the drain-side select gate line "SGD", the source-side select gate line "SGS" and the p-type semiconductor substrate "Psub" are set at the ground potential "$V_{SS}$".

Furthermore, the source line "CELSRC", the n-type well "NWELL", the p-type well "PWELL", and the bit line "BLo" not selected by the sense amplifier 3 may be charged by the voltage generating circuit 10 to "Vs", which is a second potential, and at the same time, the bit line "BLe" selected by the sense amplifier 3 may be charged to "Vb". Here, the second potential "Vs" is a potential between "Vb", which is a first potential to which the bit line "BLe" selected by the sense amplifier 3 is charged, and the ground potential "$V_{SS}$".

Thus, since the potential "Vs" is controlled by the voltage generating circuit 10, the shift of the potential "Vs" from the target potential can be reduced.

As described above, for the NAND flash memory according to this embodiment, the threshold distribution can be formed in the negative region while preventing an increase in current and pre-charge time.

Second Embodiment

In the First Embodiment, if the coupling ratio between the capacitances "C1" and "C2" shown in FIG. 8 varies, the potential "Vs" is shifted. Thus, to compensate for the shift, an additional amount of charge is required. A desired coupling ratio can be achieved by modifying the structure itself, for example, adjusting the line width or the space between the lines. However, it is actually difficult.

The function of the non-selected select gate transistor is to cut off the bit line and the source line of the cell from each other. When the potential of the source line of the cell is "Vs" in reading, if the potential of the non-selected select gate line is equal to or lower than "Vs", the cut-off can be achieved. That is, the potential "Vs", which is determined by the coupling ratio, can be adjusted by applying a potential ranging from 0 V to "Vs" to the select gate line of the non-selected block, thereby changing the capacitance of the select gate of the non-selected block.

Thus, in a Second Embodiment, there will be described an configuration in which the potential "Vs", which is determined by the coupling ratio, is adjusted to a target value by applying a voltage to the select gate line of the non-selected block, thereby changing the capacitance of the select gate of the non-selected block.

Figure 9:
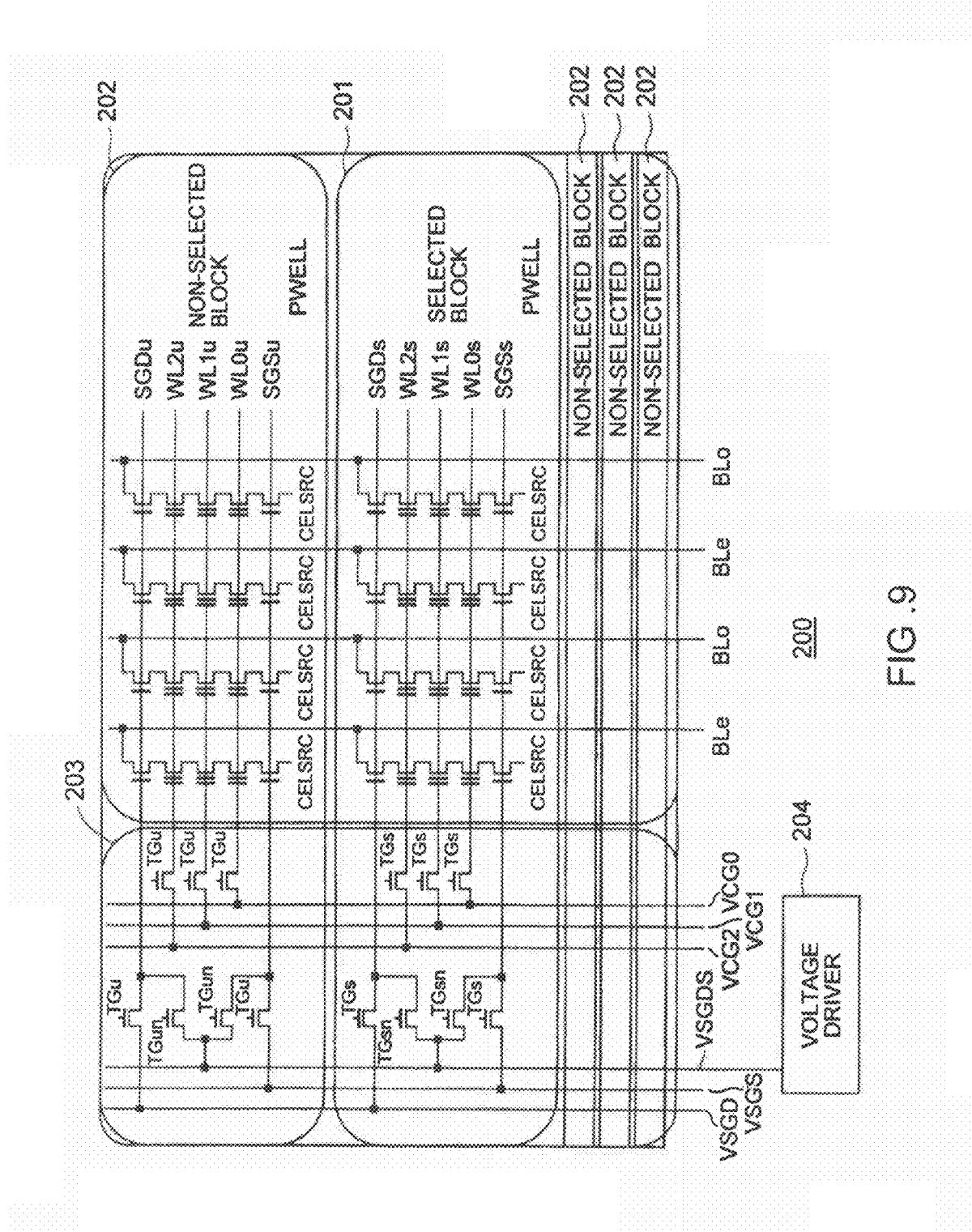
FIG. 9 is a circuit diagram showing a configuration of a NAND flash memory 200 according to the Second Embodiment, which is an aspect of the present invention, including blocks and a row decoder.

FIG. 9 is a circuit diagram showing a configuration of a NAND flash memory 200 according to the Second Embodiment, which is an aspect of the present invention, including blocks and a row decoder. The entire configuration of the NAND flash memory 200 is the same as the configuration shown in FIG. 1.

As shown in FIG. 8, the NAND flash memory 200 has a voltage driver 204 that supplies an adjustable voltage "VSGDS" to a row decoder 203.

If a transistor "TGs" of the row decoder 203 is turned on, and a transistor "TGsn" is turned off, a block 201 is selected (a selected block). As a result, voltages "VCG0" to "VCG2", "VSGS" and "VSGD" are transferred to selected word lines "WL0s" to "WL2s" and select gate lines "SGSs" and "SGDs". As a result, the word lines and the select gate lines of the selected block 201 are turned on.

On the other hand, if a transistor "TGu" of the row decoder 204 is turned off, and a transistor "TGun" is turned on, a block 202 is not selected (a non-selected block). As a result, word lines "WL0u" to "WL2u" are in the floating state. In addition, the potential "VSGDS" is transferred to non-selected select gate lines "SGSu" and "SGDu".

The voltage driver 204 changes the potential "VSGDS" within a range in which the non-selected select gate lines "SGSu" and "SGDu" are cut off. That is, to the drain-side select gates and the source-side select gates of the transistors of the block not selected by the row decoder 2, the voltage driver 204 applies a potential equal to or lower than a threshold of the transistors.

With such a configuration, the coupling ratio between the capacitances "C1" and "C2" shown in FIG. 8 in the First Embodiment can be adjusted. By adjusting the coupling ratio, the potential "Vs", which is determined by the coupling ratio, can also be adjusted to a target value.

As described above, for the NAND flash memory according to this embodiment, the threshold distribution can be formed in the negative region while preventing an increase in current and pre-charge time, as in the First Embodiment. In addition, the potential "Vs", which is determined by the coupling ratio, can be adjusted by changing the capacitance of the select gate lines of the non-selected block.

Third Embodiment

In the First Embodiment, the non-selected word lines are set in the floating state. The coupling ratio between the capacitance "C1" and "C2" shown in FIG. 8 in the First Embodiment can be changed by applying a potential to the non-selected word lines.

Thus, in a Third Embodiment, there will be described a configuration in which a potential is applied to the non-selected word lines.

Figure 10:
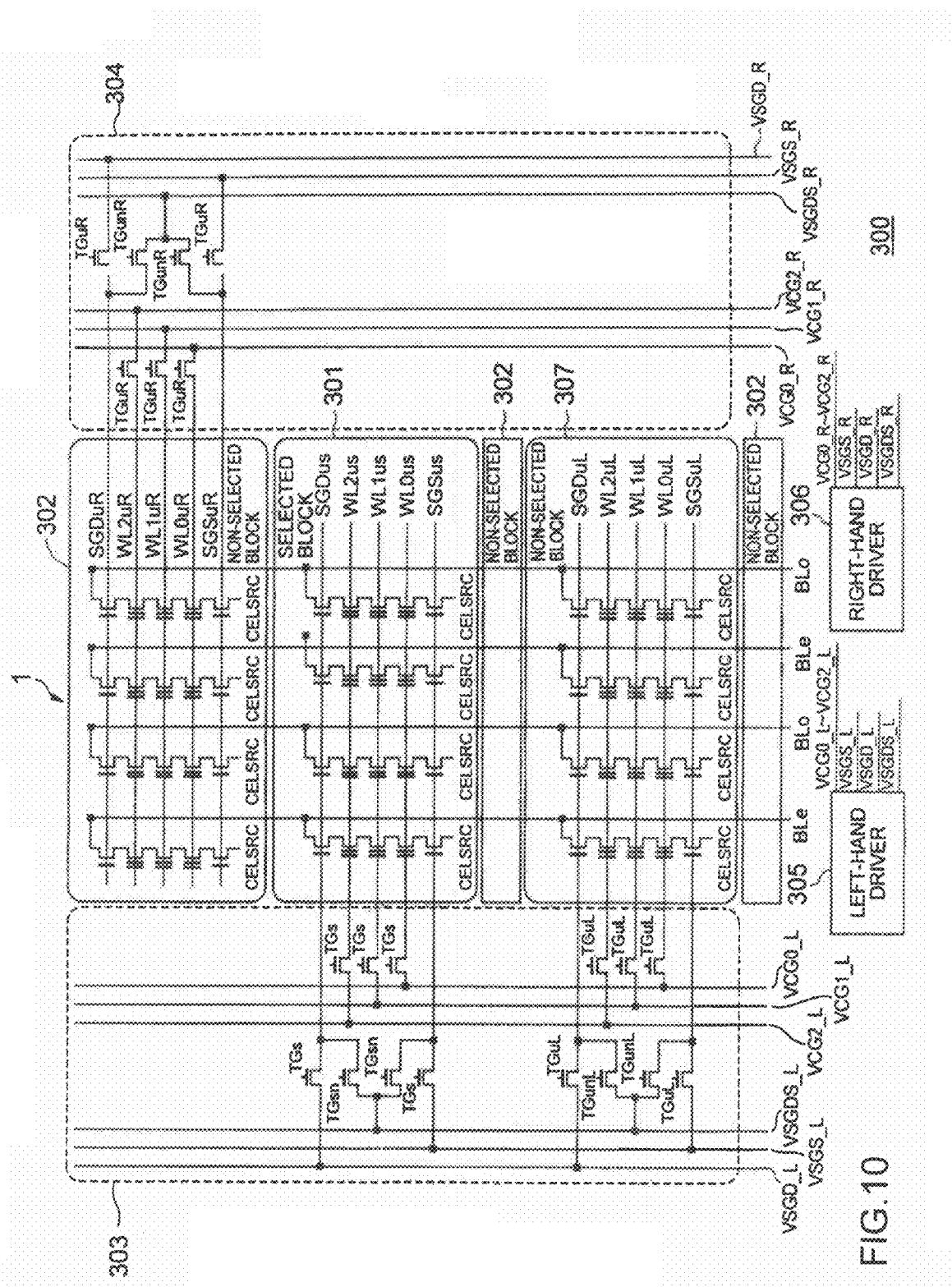
FIG. 10 is a circuit diagram showing a configuration of a NAND flash memory 300 according to the Third Embodiment of the present invention, which is an aspect of the present invention, including blocks and a row decoder.

FIG. 10 is a circuit diagram showing a configuration of a NAND flash memory 300 according to the Third Embodiment of the present invention, which is an aspect of the present invention, including blocks and a row decoder.

FIG. 10 shows an example in which row decoders 303 and 304 are disposed on the opposite sides of a memory cell array 1. The left-hand row driver 303 and the right-hand row decoder 304 have a left-hand driver 305 and a right-hand driver 306 for a control gate and a select gate, respectively. Thus, there is no need of increasing the area of the row decoder 2.

For example, if a block 301 is selected by the left-hand row decoder 303, a transistor "TGs" of the selected block 301 is turned on, and a transistor "TGsn" is turned off. As a result, voltages "VCG0_L" to "VCG2_L" are applied by the left-hand driver 305 to word lines "WL0us" to "WL2us". In addition, voltages "VSGS_L" and "VSGD_L" are applied by the left-hand driver 305 to a source-side select gate line "SGSus" and a drain-side select gate line "SGDus".

Furthermore, in a non-selected left-hand block 307, which is not selected by the left-hand row decoder 303, a transistor "TguL" is turned off, and a transistor "TGunL" is turned on. As a result, word lines "WL0uL" to "WL2uL" are in the floating state, and a voltages "VSGDS_L" is applied by the left-hand driver 305 to a source-side select gate line "SGSuL" and a drain-side select gate line "SGDuL".

On the other hand, in a non-selected block 302, which is not selected by the right-hand row decoder 304, a transistor "TGuR" is turned on, and a transistor "TGunR" is turned off. As a result, voltages "VCG0_R" to "VCG2_R" are applied by the right-hand driver 306 to word lines "WL0uR" to "WL2uR". In addition, voltages "VSGS_R" and "VSGD_R" (instead of a voltage "VSGDS_R") are applied by the right-hand driver 306 to a source-side select gate line "SGSuR" and a drain-side select gate line "SGDuR".

The coupling ratio between the capacitances "C1" and "C2" shown in FIG. 1 in the First Embodiment can be changed by adjusting the voltages "VCG0_R" to "VCG2_R" to an appropriate voltage, or in other words, by applying a potential to the word lines "WL" of the block not selected by the row decoder.

In this way, a target coupling ratio can be achieved by changing the potential of the non-selected word lines.

As described above, for the NAND flash memory according to this embodiment, as in the First Embodiment, the threshold distribution can be formed in the negative region while preventing an increase in current and pre-charge time.

Furthermore, the potential "Vs", which is determined by the coupling ratio, can be adjusted by changing the capacitance of the select gate lines of the non-selected block.

Fourth Embodiment

In the First Embodiment, as an example, there has been described a configuration in which the potential "Vb" of the selected bit line is raised at the same time as the potential "Vs" being raised.

In an Fourth Embodiment, there will be described a configuration in which the potential "Vb" of the selected bit line is raised while the potential "Vs" is being raised.

Figure 11:
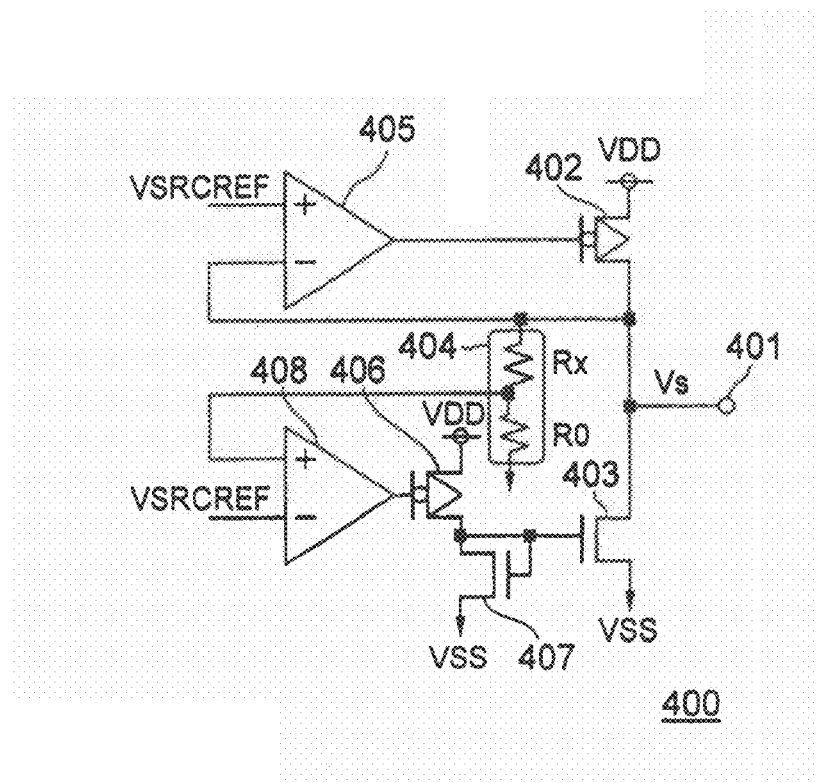
FIG. 11 is a circuit diagram showing a push-pull circuit, which is a voltage generating circuit used in the Fourth Embodiment of the present invention.
Figure 12:
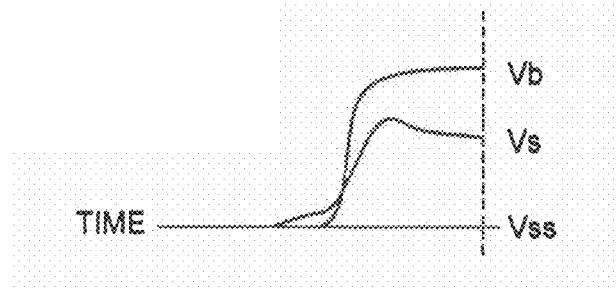
FIG. 12 is a graph showing a relationship between time and voltage applied to a selected bit line or the like of a NAND flash memory 100 during reading operation according to the Fourth Embodiment.

FIG. 11 is a circuit diagram showing a push-pull circuit, which is a voltage generating circuit used in the Fourth Embodiment of the present invention. FIG. 12 is a graph showing a relationship between time and voltage applied to a selected bit line or the like of a NAND flash memory 100 during reading operation according to the Fourth Embodiment.

As shown in FIG. 11, a push-pull circuit 400 has a first p-type MOS transistor 402 that is connected to a power supply "$V_{DD}$" at the source thereof and to an output terminal 401 for outputting a voltage "Vs" at the drain thereof, and a first n-type MOS transistor 403 that is connected between the drain of the first p-type MOS transistor 402 and a ground potential.

Furthermore, the push-pull circuit 400 has a voltage dividing circuit 404 that is composed of a voltage-dividing resistors "Rx" and "R0" and divides the potential at the output terminal 401, and a first comparator 405 that receives the potential at the output terminal 401 at the inverting input terminal thereof and a reference voltage "VSRCREF" at the non-inverting input terminal thereof, compares these inputs and outputs a signal to the gate of the first p-type MOS transistor 402.

Furthermore, the push-pull circuit 400 has a second p-type MOS transistor 406 that is connected to the power supply "$V_{DD}$" at the source thereof, and a second n-type MOS transistor 407 that is connected to the drain of the second p-type MOS transistor 406 at the drain thereof, to the drain thereof and the gate of the first n-type MOS transistor 403 at the gate thereof, and to the ground potential at the source thereof.

Furthermore, the push-pull circuit 400 has a second comparator 408 that receives the reference voltage "VSRCREF" at the inverting input terminal thereof and a voltage divided output of the voltage dividing circuit 404 at the non-inverting input terminal, compares these inputs, and outputs a signal to the gate of the second p-type MOS transistor 406.

Now, an operation of the push-pull circuit 400 configured as described above will be described.

If the voltage "Vs" of the push-pull circuit 400 is lower than the reference voltage "VSRCREF", a charging operation is conducted by turning on the first p-type MOS transistor 402 and turning off the first n-type MOS transistor.

If the output voltage "Vs" of the push-pull circuit 400 is higher than $$\left(\frac{R0 + Rx}{R0}\right) VSRCREF,$$

a discharging operation is conducted by turning off the first p-type MOS transistor 402 and turning on the first n-type MOS transistor 403.

If the output voltage "Vs" of the push-pull circuit 400 is higher than the reference voltage "VSRCREF" and lower than $$\left(\frac{R0 + Rx}{R0}\right) VSRCREF,$$

the first N-type MOS transistor 403 and the first p-type MOS transistor 402 are turned off, and thus the push-pull circuit 400 enters into the dead band. The dead band is necessary because a through current flows if the threshold of the transistor varies.

Now, as in the First Embodiment, it is supposed that the selected bit line is charged with the source line, the p-type well and the non-selected bit line (shielded bit line) of the cell being in the floating state. In this case, if the voltage $$Vs = Vb\left(\frac{C1}{C1 + C2}\right),$$

which is determined by the coupling ratio, converges to the dead band, the output voltage "Vs" may be indeterminable within a range $$\left(VSRCREF < V_S < \left(\frac{R0 + Rx}{R0}\right)VSRCREF\right).$$

Thus, instead of charging the selected bit line "BLe" with the source line, the p-type semiconductor substrate and the non-selected bit line (shielded bit line) "BLo" of the cell being in the floating state, the push-pull circuit 400 for the power supply "Vs" for the source line, the p-type semiconductor substrate and the shielded bit line of the cell is turned on slightly earlier than charging of the selected bit line (FIG. 12).

That is, in a block not selected by a row decoder 2, the drain-side select gate line "SGD", the source-side select gate line "SGS" and the p-type semiconductor substrate "Psub" are set at the ground potential "$V_{SS}$".

Furthermore, while the source line "CELSRC", the n-type well "NWELL", the p-type well "PWELL" and the bit line "BLo" not selected by the sense amplifier 3 are being charged to the second potential "Vs" by the voltage generating circuit 10, the bit line "BLe" selected by the sense amplifier 3 is charged to the first potential "Vb". As described above, the second potential "Vs" is a potential between the first potential "Vb" to which the bit line "BLe" selected by the sense amplifier 3 is charged and the ground potential "$V_{SS}$".

Thus, the second potential "Vs", which is determined by the coupling ratio, is expressed as follows.

$$V_S = Vb\left(\frac{C1}{C1 + C2}\right) + \alpha$$

In this formula, reference character a represents an initial charge potential, which occurs as a result of the generator for the potential "Vs" being turned on slightly earlier than charging of the selected bit line.

If the condition $$\left(Vb\left(\frac{C1}{C1 + C2}\right) + \alpha\right) < \left(\left(\frac{R0 + Rx}{R0}\right)VSRCREF\right)$$

is satisfied, the first n-type MOS transistor 407 of the push-pull circuit is turned off after the potential determined by the coupling ratio settles. As a result, a discharge operation occurs, and the potential "Vs" converges to the following value.

$$V_S = \left(\frac{R0 + Rx}{R0}\right)VSRCREF$$

By conducting charging to "Vs" in advance, the required amount of charge may increase compared with a case where charging to "Vs" is conducted in the floating state.

However, compared with a case where charging to "Vs" is completely conducted, the amount of charge can be reduced. The pre-charge time increases only slightly.

Furthermore, within the set-up period of "Vb", the operating time of the NAND flash memory does not increase due to the pre-charge time.

As described above, for the NAND flash memory according to this embodiment, as in the First Embodiment, the threshold distribution can be formed in the negative region while preventing an increase in current and pre-charge time.

What is claimed is:

1. A NAND flash memory that is read while a selected bit line and a non-selected bit line are adjacent to each other, comprising:

a memory cell array having a plurality of blocks each of which is composed of a plurality of memory cell units, each of said memory cell units having a plurality of electrically rewritable memory cells that are connected to each other and composed of a p-type well surrounded by an n-type well formed in a p-type semiconductor substrate, drain-side select gate transistors each of which connects a memory cell unit to a bit line and is connected to a drain-side select gate line at a first gate thereof, and source-side select gate transistors each of which connects a memory cell unit to a source line and is connected to a source-side select gate line at a second gate thereof, wherein a first bit line that is selected is charged when the p-type semiconductor substrate is set at a ground potential, and the source lines, the n-type wells, the p-type wells, and a second bit line that is not selected are in a floating state.

2. The NAND flash memory according to claim 1, wherein a first potential equal to or lower than thresholds of the drain-side select gate transistor and the source-side select gate transistor is applied to the drain-side select gate line and the source-side select gate line of a block that is not selected.

3. The NAND flash memory according to claim 1, wherein a second potential is applied to the word lines of a block that is not selected.

4. The NAND flash memory according to claim 2, wherein a second potential is applied to the word lines of said block that is not selected.

5. A NAND flash memory that is read while a selected bit line and a non-selected bit line are adjacent to each other, comprising:

a memory cell array having a plurality of blocks each of which is composed of a plurality of memory cell units, each of said memory cell units having a plurality of electrically rewritable memory cells that are connected to each other and composed of a p-type well surrounded by an n-type well formed in a p-type semiconductor substrate, drain-side select gate transistors each of which connects a memory cell unit to a bit line and is connected to a drain-side select gate line at a first gate thereof, and source-side select gate transistors each of which connects a memory cell unit to a source line and is connected to a source-side select gate line at a second gate thereof, wherein a first bit line that is selected is charged to a first potential at the same time as the p-type semiconductor substrate being set at a ground potential, and the source lines, the n-type wells, the p-type wells, and a second bit line that is not selected being charged to a second potential that is between said first potential and said ground potential.

6. The NAND flash memory according to claim 5, wherein a third potential equal to or lower than thresholds of the drain-side select gate transistor and the source-side select gate transistor is applied to the drain-side select gate line and the source-side select gate line of a block that is not selected.

7. The NAND flash memory according to claim 5, wherein a third potential is applied to the word lines of a block that is not selected.

8. The NAND flash memory according to claim 6, wherein a fourth potential is applied to the word lines of said block that is not selected.

9. A NAND flash memory that is read while a selected bit line and a non-selected bit line are adjacent to each other, comprising:
a memory cell array having a plurality of blocks each of which is composed of a plurality of memory cell units, each of said memory cell units having a plurality of electrically rewritable memory cells that are connected to each other and composed of a p-type well surrounded by an n-type well formed in a p-type semiconductor substrate, drain-side select gate transistors each of which connects a memory cell unit to a hit line and is connected to a drain-side select gate line at a first gate thereof, and source-side select gate transistors each of which connects a memory cell unit to a source line and is connected to a source-side select gate line at a second gate thereof,
wherein
a first bit line that is selected is charged to a first potential while the p-type semiconductor substrate is being set at a ground potential, and the source lines, the n-type wells, the p-type wells, and a second bit line that is not selected are being charged to a second potential that is between said first potential and said ground potential.

10. The NAND flash memory according to claim 9, wherein
a third potential equal to or lower than thresholds of the drain-side select gate transistor and the source-side select gate transistor is applied to the drain-side select gate line and the source-side select gate line of a block that is not selected.

11. The NAND flash memory according to claim 9, wherein
a third potential is applied to the word lines of said block that is not selected.

12. The NAND flash memory according to claim 10, wherein
a fourth potential is applied to the word lines of said block that is not selected.

* * * * *